(12) United States Patent
Park et al.

(10) Patent No.: US 12,433,141 B2
(45) Date of Patent: Sep. 30, 2025

(54) DISPLAY DEVICE

(71) Applicant: Samsung Display Co., LTD., Yongin-si (KR)

(72) Inventors: Byoungkyoo Park, Yongin-si (KR); Yongil Kim, Yongin-si (KR); Wee-Joon Jeong, Yongin-si (KR); Jangun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 279 days.

(21) Appl. No.: 18/218,078

(22) Filed: Jul. 4, 2023

(65) Prior Publication Data

US 2024/0122049 A1    Apr. 11, 2024

(30) Foreign Application Priority Data

Oct. 11, 2022    (KR) .................. 10-2022-0129971

(51) Int. Cl.
| | |
|---|---|
| *G06F 1/16* | (2006.01) |
| *H05K 5/00* | (2025.01) |
| *H05K 7/00* | (2006.01) |
| *H05K 7/20* | (2006.01) |
| *H10K 59/80* | (2023.01) |

(52) U.S. Cl.
CPC ..... *H10K 59/8794* (2023.02); *H05K 7/20963* (2013.01); *H05K 7/2099* (2013.01)

(58) Field of Classification Search
CPC .......... H05K 7/20963; H05K 7/2099; H10K 59/8794; G06F 1/203; G06F 1/206
See application file for complete search history.

(56) References Cited

U.S. PATENT DOCUMENTS

| | | | | |
|---|---|---|---|---|
| 5,383,340 | A | * | 1/1995 | Larson .................. H01L 23/427 361/679.08 |
| 6,097,597 | A | * | 8/2000 | Kobayashi ............ H01L 23/427 361/717 |
| 7,160,619 | B2 | | 1/2007 | Clovesko et al. |
| 7,276,273 | B2 | | 10/2007 | Clovesko et al. |
| 7,541,723 | B2 | | 6/2009 | Hayashi et al. |
| 9,482,885 | B2 | | 11/2016 | Joo et al. |
| 10,907,909 | B2 | | 2/2021 | Jung et al. |
| 11,547,028 | B2 | * | 1/2023 | Jung .................... H05K 7/2099 |
| 2004/0009353 | A1 | * | 1/2004 | Knowles ............... H01L 23/373 257/E23.101 |
| 2014/0090808 | A1 | * | 4/2014 | Bessho .................. C09K 5/063 165/104.17 |

(Continued)

FOREIGN PATENT DOCUMENTS

| | | |
|---|---|---|
| KR | 100560467 B1 | 3/2006 |
| KR | 100718951 B1 | 5/2007 |

(Continued)

*Primary Examiner* — Anthony M Haughton
(74) *Attorney, Agent, or Firm* — CANTOR COLBURN LLP

(57) ABSTRACT

A display device includes a display panel, a heat spread sheet below the display panel and in contact with a first surface of the display panel, and a heat storage sheet in contact with at least a portion of the heat spread sheet. The heat spread sheet includes a first phase change material. The heat storage sheet includes a second phase change material having a boiling point greater than a boiling point of the first phase change material.

20 Claims, 9 Drawing Sheets

(56) References Cited

U.S. PATENT DOCUMENTS

| | | | | |
|---|---|---|---|---|
| 2016/0109911 A1* | 4/2016 | Han | ......................... | G06F 1/203 |
| | | | | 361/679.46 |
| 2016/0341486 A1* | 11/2016 | Kim | ...................... | H01L 23/427 |
| 2018/0263138 A1* | 9/2018 | Wu | ....................... | H05K 7/2099 |
| 2021/0337700 A1* | 10/2021 | Jung | ................... | F28D 15/0275 |
| 2022/0158273 A1* | 5/2022 | Khateeb Razack | .......................... | |
| | | | | H01M 10/617 |

FOREIGN PATENT DOCUMENTS

| | | |
|---|---|---|
| KR | 1020200110558 A | 9/2020 |
| KR | 102266187 B1 | 6/2021 |

* cited by examiner

DISPLAY DEVICE

This application claims priority to Korean Patent Application No. 10-2022-0129971, filed on Oct. 11, 2022, and all the benefits accruing therefrom under 35 U.S.C § 119, the content of which in its entirety is herein incorporated by reference.

BACKGROUND

1. Field

Embodiments of the invention relate to a display device having a thermal radiation function.

2. Description of the Related Art

As various types of display device such as television set, laptop computer, and mobile phone are recently being increased in performance and decreased in size at high speeds, electronic components built therein are being increased in capacity and integration. Therefore, a large amount of heat may be generated from electronic components of display devices. The heat generated from display devices may cause a reduction in lifespan of products or induces failure or malfunction of components. Many studies are being conducted on measures to outwardly discharge heat generated from display devices.

SUMMARY

An embodiment of the invention provides a display device having improved thermal radiation performance.

According to an embodiment of the invention, a display device includes: a display panel; a heat spread sheet below the display panel and in contact with a first surface of the display panel; and a heat storage sheet in contact with at least a portion of the heat spread sheet. In such an embodiment, the heat spread sheet includes a first phase change material. In such an embodiment, the heat storage sheet includes a second phase change material having a boiling point greater than a boiling point of the first phase change material.

In an embodiment, the first phase change material may include a material whose phase is changed from liquid to gaseous states by receiving heat from the display panel.

In an embodiment, the second phase change material may include a material whose phase is changed from solid to liquid states by receiving heat from the heat spread sheet.

In an embodiment, a planar area of the heat spread sheet may be greater than a planar area of the heat storage sheet.

In an embodiment, the heat spread sheet may be in contact with an entirety of the first surface. The heat storage sheet may overlap the heat spread sheet when viewed in a plan view.

In an embodiment, a volume of the heat storage sheet may be greater than a volume of the heat spread sheet.

In an embodiment, the heat storage sheet may be provided in plural. In such an embodiment, a plurality of heat storage sheets may be spaced apart from each other on a rear surface of the heat spread sheet.

In an embodiment, each of the heat spread sheet and the heat storage sheet may be provided in plural. In such an embodiment, a plurality of heat spread sheets and a plurality of heat storage sheets may be disposed alternately with each other.

In an embodiment, the heat spread sheet may further include a first heat transfer chamber which surrounds the first phase change material. In such an embodiment, the heat storage sheet may further include a second heat transfer chamber which surrounds the second phase change material.

In an embodiment, each of the first and second heat transfer chambers may include a metal whose thermal conductivity is high.

In an embodiment, the heat spread sheet may include: a first part in which the first phase change material is disposed; and a second part in which the first phase change material is not disposed.

In an embodiment, the heat storage sheet may be in contact with the first part.

In an embodiment, the display panel may include a base layer, a circuit layer on the base layer, and a display element layer on the circuit layer. The heat spread sheet may overlap the display element layer when viewed in a plan view.

According to an embodiment of the invention, a display device includes: a display panel; and a heat radiation sheet below the display panel and in contact with a first surface of the display panel. In such an embodiment, the heat radiation sheet includes: a diffusion part adjacent to the display panel, where a first phase change material which receives heat from the display panel is disposed in the diffusion part; a storage part adjacent to the first phase change material, where a second phase change material which receives heat from the first phase change material is disposed in the storage part; and a heat transfer chamber which surrounds each of the first phase change material and the second phase change material. In such an embodiment, a thermal conductivity of the first phase change material is greater than a thermal conductivity of the heat transfer chamber.

In an embodiment, a boiling point of the second phase change material may be greater than a boiling point of the first phase change material.

In an embodiment, the first phase change material may include a material whose phase is changed from liquid to gaseous states by the heat from the display panel, and the second phase change material may include a material whose phase is changed from solid to liquid states by the heat from the first phase change material.

In an embodiment, the diffusion part may be below the display panel. The storage part may be below and overlap the diffusion part when viewed in a plan view.

In an embodiment, a volume of the storage part may be greater than a volume of the diffusion part.

In an embodiment, each of the diffusion part and the storage part may be provided in plural. In such an embodiment, a plurality of diffusion parts and the plurality of storage parts may be disposed alternately with each other.

In an embodiment, the display panel may include a base layer, a circuit layer on the base layer, and a display element layer on the circuit layer. In such an embodiment, the diffusion part may overlap the display element layer when viewed in a plan view. In such an embodiment, the storage part may not overlap the display element layer when viewed in the plan view.

DETAIL PARTED DESCRIPTION

Figure 1:
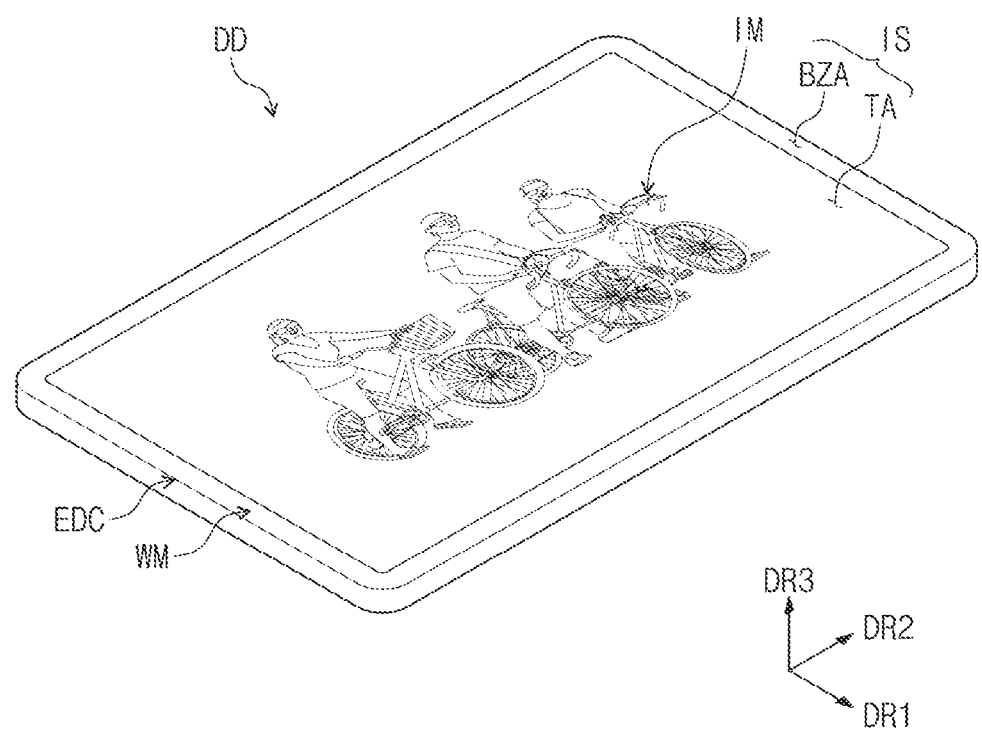
FIG. 1 illustrates a perspective view showing a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be therebetween.

Like reference numerals refer to like elements throughout. Moreover, in the drawings, thicknesses, ratios, and dimensions of components are exaggerated for effectively explaining the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various components, these components should not be limited by these terms. These terms are only used to distinguish one component from another component. For example, a first component could be termed a second component, and vice versa without departing from the scope of the invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
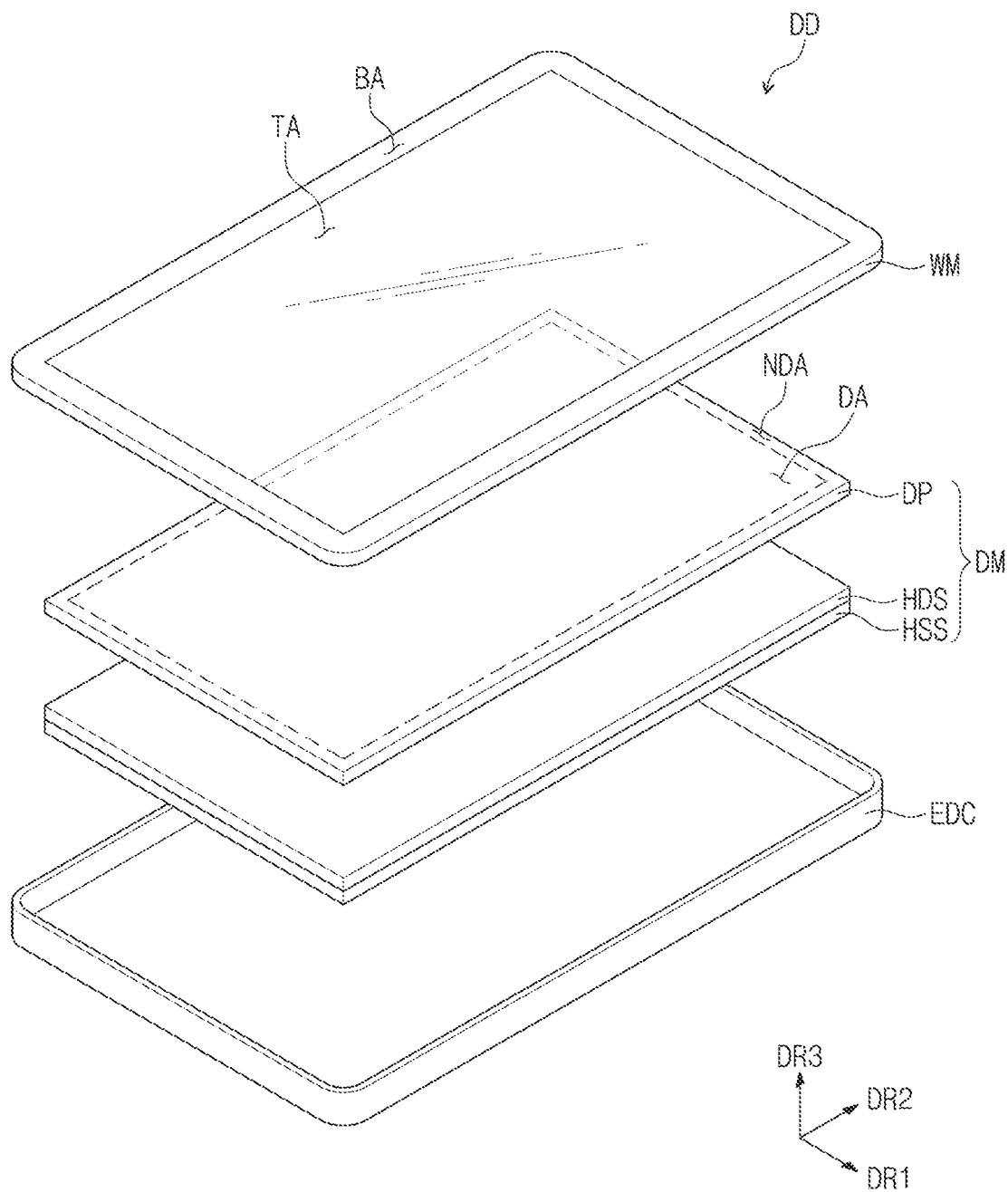
FIG. 2 illustrates an exploded perspective view showing a display device according to an embodiment of the invention.
Figure 3:
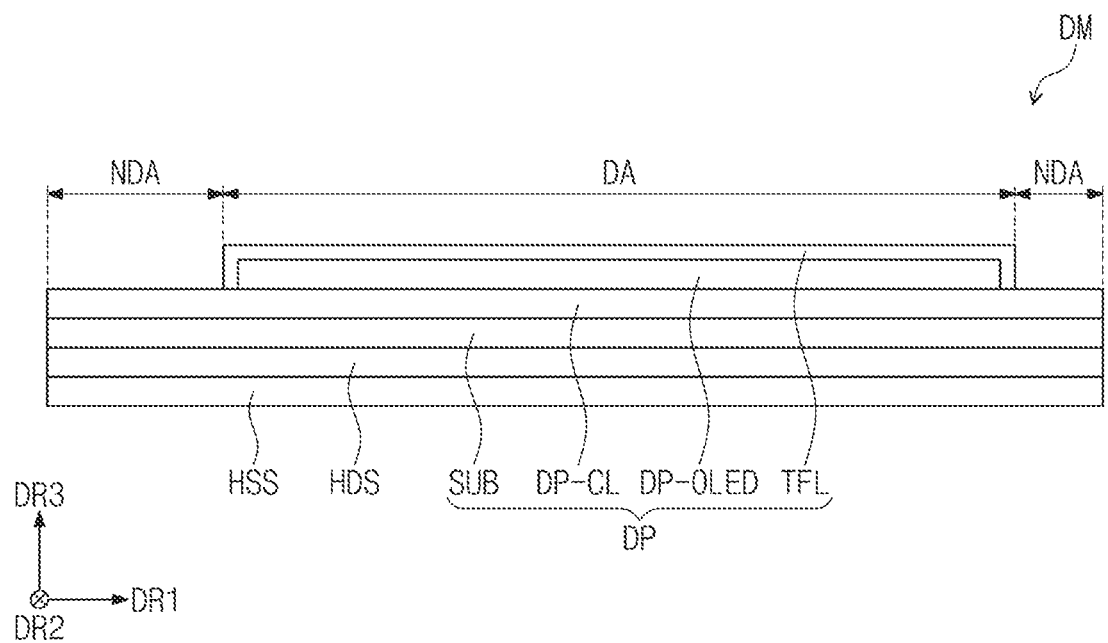
FIG. 3 illustrates a cross-sectional view showing a display module according to an embodiment of the invention.

FIG. 1 illustrates a perspective view showing a display device according to an embodiment of the invention. FIG. 2 illustrates an exploded perspective view showing a display device according to an embodiment of the invention. FIG. 3 illustrates a cross-sectional view showing a display module according to an embodiment of the invention.

Referring to FIGS. 1 and 2, a display device DD may be an apparatus that is activated with electrical signals. The display device DD according to an embodiment of the invention may be applicable not only to large-sized electronic products such as television sets and monitors, but to small and medium-sized electronic products such as mobile phones, tablet computers, automotive navigation systems, game consoles, and smart watches. These products are merely presented as examples, and the display device DD can be adopted for any suitable electronic apparatus unless departing from the spirit of the inventive concepts. FIG. 1 depicts an embodiment where the display device DD is a television, but the invention is not limited thereto.

The display device DD may have a rectangular shape having long sides in a first direction DR1 and short sides in a second direction DR2 that intersects the first direction DR1. However, the shape of the display device DD is not limited thereto, and the display device DD may have various shapes. The display device DD may display an image IM in a third direction DR3 on a display surface IS parallel to each of the first direction DR1 and the second direction DR2. Here, the third direction DR3 may be a thickness direction of the display device DD. The display surface IS that displays the image IM may correspond to a front surface of the display device DD.

In this description, front and rear surfaces (or top and bottom surfaces) of each component are defined based on a direction along which the image IM is displayed. The front and rear surfaces may be opposite to each other in the third direction DR3, and a normal direction to each of the front and rear surfaces may be parallel to the third direction DR3.

An interval in the third direction DR3 between the front and rear surfaces may correspond to a thickness in the third direction DR3 of the display device DD. Directions indicated by the first, second, and third directions DR1, DR2, and DR3 are relative concepts and may denote other directions.

The display device DD may detect an external input that is externally applied. The external input may include any suitable types of input applied from outside the display device DD. The display device DD according to an embodiment of the invention may detect a user's input that is externally applied. The user's external input may include a part of user's body, light, heat, pressure, or any various types of input. In addition, depending on a structure of the display device DD, the display device DD may detect a user's input that is applied to a lateral or rear surface of the display device DD, but the invention is not limited to a particular embodiment.

The display device DD according to an embodiment of the invention may detect inputs from an input tool (e.g., stylus pen, active pen, touch pen, or electronic pen) other than user's external input.

The front surface of the display device DD may be divided into a transmission region TA and a bezel region BZA. The transmission region TA may be an area on which the image IM is displayed. A user may recognize the image IM through the transmission region TA. In an embodiment, as shown in FIG. 1, the transmission region TA may have a rectangular shape with rounded vertices. This, however, is illustrated as an example, and the transmission region TA may have various shapes without being limited to a particular embodiment.

The bezel region BZA may be adjacent to the transmission region TA. The bezel region BZA may have a certain color. The bezel region BZA may surround the transmission region TA. Therefore, the bezel region BZA may substantially define a shape of the transmission region TA. This, however, is illustrated as an example, and the bezel region BZA may be disposed adjacent to only one side of the transmission region TA or may be omitted. The display device DD according to an embodiment of the invention may be variously modified without being limited to a particular embodiment.

As shown in FIG. 2, an embodiment of the display device DD may include a window WM, a display module DM, and an outer casing EDC.

The window WM may include or be formed of a transparent material capable of emitting the image IM. In an embodiment, for example, the window WM may include or be formed of glass, sapphire, or plastic. In an embodiment, the window WM may have a single layer structure, but the invention is not limited thereto and the window WM may be defined by a plurality of layers.

Although not shown, the bezel region BZA of the display device DD may be substantially provided as an area where a material including a certain color is printed on a portion of the window WM. In an embodiment of the invention, the window WM may include a light-shield pattern for defining the bezel region BZA. The light-shield pattern may be a colored organic layer formed by, for example, a coating process.

The window WM may be coupled through an adhesive film to the display module DM. In an embodiment of the invention, the adhesive film may include an optically clear adhesive (OCA) film. The adhesive film, however, is not limited thereto, and the adhesive film may include a typical adhesive or glue. In an embodiment, for example, the adhesive film may include an optically clear resin (OCR) or a pressure sensitive adhesive (PSA) film.

An antireflective layer (not shown) may further be disposed between the window WM and the display module DM. The antireflective layer may reduce a reflectance of external light that is incident from above the window WM. The antireflective layer according to an embodiment of the invention may include a retarder and a polarizer. The retarder may be of a film type or a liquid crystal coating type, and may include a 212 retarder or a 214 retarder. The polarizer may also be of a film type or a liquid crystal coating type. The film type may include a stretchable synthetic resin film, and the liquid crystal coating type may include arrayed liquid crystals. The retarder and the polarizer may collectively achieve a single polarizing film.

In an embodiment of the invention, the antireflective layer may include color filters. An arrangement of the color filters may be determined in consideration of colors of light rays generated from a plurality of pixels included in a display panel DP which will be discussed below. The antireflective layer may further include a light-shield pattern.

The display module DM may be disposed between the display module DM and the outer casing EDC. The display module DM may include a display panel DP, a heat spread sheet HDS, and a heat storage sheet HSS.

The display panel DP may include a display region DA on which the image IM is displayed and a non-display region NDA adjacent to the display region DA. The display region DA may be an area that emits the image IM provided from the display panel DP. The non-display region NDA may surround the display region DA. This, however, is illustrated as an example, and the non-display region NDA may be defined to have various shapes without being limited to a particular embodiment. In an embodiment, for example, the non-display region NDA may be provided adjacent to one or both opposing sides of the display region DA. According to an embodiment, the display region DA of the display panel DP may correspond to at least a portion of the transmission region TA, and the non-display region NDA may correspond to the bezel region BZA.

An emissive display panel may be adopted as the display panel DP according to an embodiment of the invention. In an embodiment, for example, the display panel DP may be an organic light emitting display panel, an inorganic light emitting display panel, or a quantum-dot light emitting display panel. An emission layer of the organic light emitting display panel may include an organic light emitting material. An emission layer of the inorganic light emitting display panel may include an inorganic light emitting material. An emission layer of the quantum-dot light emitting display panel may include a quantum-dot or a quantum-rod. Hereinafter, for convenience of description, embodiments where the display panel DP is an organic light emitting display panel will be described in detail.

In an embodiment of the invention, the display device DD may further include an input sensing layer that detects an external input (e.g., touch event). The input sensing layer may be directly disposed on the display panel DP. According to an embodiment of the invention, a series of processes may be employed to form the input sensing layer on the display panel DP. In an embodiment, for example, the input sensing layer is directly disposed on the display panel DP, such that no adhesive film may be located between the input sensing layer and the display panel DP. The invention, however, is not limited thereto. In an alternative embodiment, an adhesive film may be disposed between the input sensing layer and the display panel DP. In such an embodiment, the input sensing layer and the display panel DP may not be fabricated in a series of processes, but after the input sensing layer is fabricated in a separate process different from that used for forming the display panel DP, the input sensing layer may be fixed through an adhesive film to a top surface of the display panel DP.

Referring to FIG. 3, the display panel DP may include a base layer SUB, a circuit layer DP-CL, a display element layer DP-OLED, and a dielectric layer TFL.

The base layer SUB may be a glass substrate, a metal substrate, or a polymer substrate. However, some embodiments of the invention are not limited thereto, and the base layer SUB may be an inorganic layer, an organic layer, or a composite material layer.

The circuit layer DP-CL may be disposed on the base layer SUB. The circuit layer DP-CL may include at least one intermediate dielectric layer and at least one circuit element. The intermediate dielectric layer may include at least one intermediate inorganic layer and at least one intermediate organic layer. The circuit element may include signal lines and a pixel driver circuit.

The display element layer DP-OLED may be disposed on the circuit layer DP-CL. The display element layer DP-OLED may include a plurality of organic light emitting diodes. The display element layer DP-OLED may further include an organic layer such as a pixel definition layer. The display element layer DP-OLED may overlap the display region DA.

The dielectric layer TFL may cover the display element layer DP-OLED. The dielectric layer TFL may be a thin encapsulation layer. The dielectric layer TFL may protect the display element layer DP-OLED against foreign substances such as moisture, oxygen, and dust particles. This, however, is illustrated as an example, and in an alternative embodiment, an encapsulation substrate may be provided instead of the dielectric layer TFL. In such an embodiment, the encapsulation substrate may stand opposite to the base layer SUB, and the circuit layer DP-CL and the display element layer DP-OLED may be disposed between the encapsulation substrate and the base layer SUB.

Although not shown, the display panel DP and the heat spread sheet HDS may be provided with an adhesive layer therebetween, and the display panel DP and the heat spread sheet HDS are attached to each other via the adhesive layer. The adhesive layer may include a typical adhesive, such as a pressure sensitive adhesive (PSA), an optically clear adhesive (OCA), or an optical clear resin (OCR).

The heat spread sheet HDS may be disposed below the display panel DP. The heat storage sheet HSS may be disposed below the heat spread sheet HDS and may be in contact with at least a portion of the heat spread sheet HDS. The heat spread sheet HDS may receive heat from the display panel DP and transfer the heat to the heat storage sheet HSS, and the heat storage sheet HSS may receive and store the heat transferred from the heat spread sheet HDS. Each of the heat spread sheet HDS and the heat storage sheet HSS may have a chamber shape. The heat spread sheet HDS and the heat storage sheet HSS will be further described in detail below.

The outer casing EDC and the window WM may be coupled to define an appearance of the display device DD. The outer casing EDC may absorb externally applied impact and prevent the display module DM from receiving foreign substances and moisture, thereby protecting components accommodated in the outer casing EDC. In an embodiment of the invention, the outer casing EDC may have a structure in which a plurality of storage members are combined to each other.

The display device DD according to an embodiment may further include an electronic module that includes various functional modules for driving the display module DM, a power supply module that supplies a power used for an overall operation of the display device DD, and a bracket that is coupled to the outer casing EDC to thereby divide an internal space of the display device DD.

Figure 4:
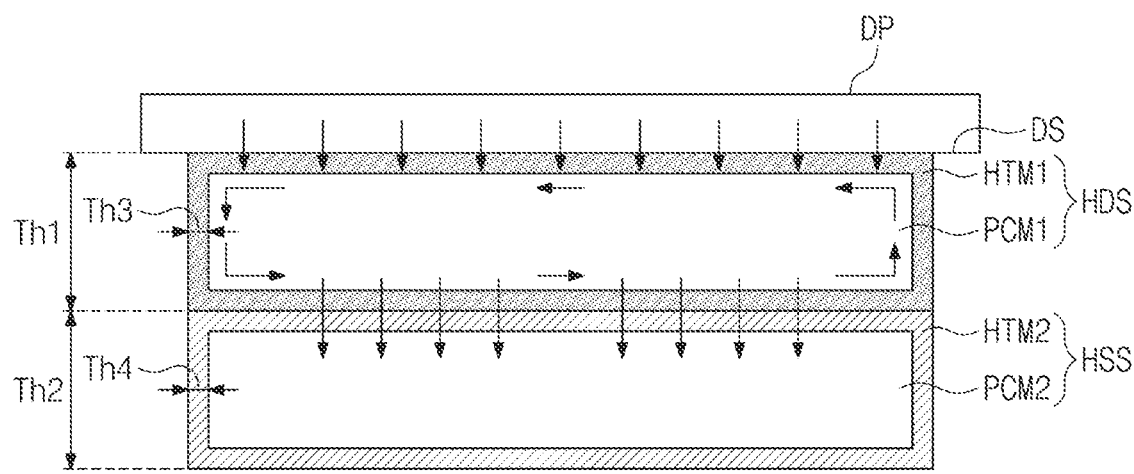
FIG. 4 illustrates an enlarged cross-sectional view showing a heat spread sheet and a heat storage sheet according to an embodiment of the invention.

FIG. 4 illustrates an enlarged cross-sectional view showing a heat spread sheet and a heat storage sheet according to an embodiment of the invention.

Referring to FIG. 4, in an embodiment, the heat spread sheet HDS may be disposed below the display panel DP and may be in contact with a bottom surface DS (or first surface) of the display panel DP. In an embodiment, for example, the heat spread sheet HDS may be in contact with a portion of the first surface DS of the display panel DP. The heat storage sheet HSS may be disposed below and in contact with the heat spread sheet HDS.

The heat spread sheet HDS may serve to receive heat generated from the display panel DP and to discharge the received heat. The heat spread sheet HDS may include a first heat transfer chamber HTM1 provided in the form of a chamber with an internal space defined therein, and may also include a first phase change material PCM1 provided in the internal space of the first heat transfer chamber HTM1. In an embodiment, for example, the first heat transfer chamber HTM1 may be provided to surround the first phase change material PCM1. According to an embodiment of the invention, the first phase change material PCM1 may include a material whose phase is changed (i.e., a material having a phase change) from liquid to gaseous states by receiving heat from the display panel DP. In an embodiment, for example, the first phase change material PCM1 may include at least one selected from methanol, ethanol, acetone, isopropyl alcohol (IPA), and water.

The heat spread sheet HDS may receive heat generated from the display panel DP, for example, the display element layer (see DP-CL of FIG. 3). The heat transferred to the heat spread sheet HDS may be introduced through the first heat transfer chamber HTM1 to the first phase change material PCM1. The first phase change material PCM1 may maintain its liquid state at a room temperature, and may be evaporated from liquid to gaseous states due to the heat introduced through the first heat transfer chamber HTM1 to the first phase change material PCM1. In an embodiment, for example, the first heat transfer chamber HTM1 may have a top side (or an upper portion) close to the display panel DP from which heat is transferred, and the first phase change material PCM1 may be evaporated from liquid to gaseous states at its portion adjacent to the top side of the first heat transfer chamber HTM1.

A gas evaporated at a location adjacent to the top side of the first heat transfer chamber HTM1 may circulate by convection in the internal space of the first heat transfer chamber HTM1, and thus the gas may move toward a location adjacent to a bottom side of the first heat transfer chamber HTM1. The gas that moves to the location adjacent to the bottom side (or a lower portion) of the first heat transfer chamber HTM1 may transfer heat to the heat storage sheet HSS disposed below the heat spread sheet HDS. In an embodiment, for example, the gas that moves to the location adjacent to the bottom side of the first heat transfer chamber HTM1 may force the heat storage sheet HSS to receive heat transferred through the first heat transfer chamber HTM1. As the evaporated first phase change material PCM1 transfers the heat to the heat storage sheet HSS, the evaporated first phase change material PCM1 may be liquefied. In an embodiment, for example, the evaporated portion of the first phase change material PCM1 may be liquefied from gaseous to liquid states at the location adjacent to the bottom side of the first heat transfer chamber HTM1, which is close to the heat storage sheet HSS to which the heat is transferred.

A convection phenomenon in the internal space of the first heat transfer chamber HTM1 may cause that a liquid liquefied at the location adjacent to the bottom side of the first heat transfer chamber HTM1 may move back to the location adjacent to the top side of the first heat transfer chamber HTM1. At the location adjacent to the top side of the first heat transfer chamber HTM1, a portion of the first phase change material PCM1 may be evaporated due to heat transferred from the display panel DP to the first phase change material PCM1, and at the location adjacent to the bottom side of the first heat transfer chamber HTM1, the evaporated first phase change material PCM1 may emit heat to transform back to the liquid state. Through the procedure mentioned above, the heat spread sheet HDS may produce efficient heat diffusion to the heat storage sheet HSS. In a case where an amount per unit time of heat transferred from the display panel DP to the heat spread sheet HDS is greater than that of heat emitted from the heat spread sheet HDS, the first phase change material PCM1 may all be evaporated when the procedure continues as discussed above.

The first heat transfer chamber HTML may have a shape that surrounds the first phase change material PCM1. Because the first heat transfer chamber HTML is desired to receive heat from the display panel DP and to transfer the heat to the first phase change material PCM1, the first heat transfer chamber HTM1 may include or be formed of a material whose thermal conductivity is high, i.e., a material having high thermal conductivity. Here, the thermal conductivity is high when greater than a predetermined thermal conductivity determined to effectively perform the functions thereof as described herein. In an embodiment, for example, the first heat transfer chamber HTML may include or be formed of at least one selected from aluminum (Al), gold (Au), silver (Ag), and copper (Cu). According to an embodiment of the invention, the first phase change material PCM1 may have a thermal conductivity greater than that of the first heat transfer chamber HTM1. In an embodiment, for example, the first phase change material PCM1 may have a thermal conductivity in a range from about 1,000 watts per meter-kelvin (W/mK) to about 10,000 W/mK, and the first heat transfer chamber HTML may have a thermal conductivity in a range from about 200 W/mK to about 500 W/mK.

The first heat transfer chamber HTM1 may have a thickness sufficient enough to protect its inside or the first phase change material PCM1 from external impact and so forth. In an embodiment, for example, the first heat transfer chamber HTM1 may have a thickness Th3 in a range from about 0.2 millimeter (mm) to about 0.3 mm.

The heat storage sheet HSS may serve to store heat discharged from the heat spread sheet HDS. The heat storage sheet HSS may include a second heat transfer chamber HTM2 provided in the form of a chamber with an internal space defined therein, and may also include a second phase change material PCM2 provided in the internal space of the second heat transfer chamber HTM2. In an embodiment, for example, the second heat transfer chamber HTM2 may be provided to surround the second phase change material PCM2. The second phase change material PCM2 may be different from the first phase change material PCM1. The second phase change material PCM2 may have a boiling point greater than that of the first phase change material PCM1. According to an embodiment of the invention, the second phase change material PCM2 may include a material whose phase is changed from solid to liquid states by receiving heat from the heat spread sheet HDS. In an embodiment, for example, the second phase change material PCM2 may include a paraffin wax.

Heat discharged from the heat spread sheet HDS may be transferred to the heat storage sheet HSS. The heat transferred to the heat spread sheet HDS may be introduced through the second heat transfer chamber HTM2 to the second phase change material PCM2. The second phase change material PCM2 may maintain its solid state at a room temperature, and may be melted from solid to liquid states due to the heat transferred through the second heat transfer chamber HTM2 to the second phase change material PCM2. In an embodiment, for example, the second heat transfer chamber HTM2 may have a top side close to the heat spread sheet HDS from which heat is transferred, and the second phase change material PCM2 may be melted from solid to liquid states at a portion adjacent to the top side of the second heat transfer chamber HTM2.

Latent heat is heat or energy absorbed by a substance during a change in its physical state. The latent heat is in proportion to latent heat constant and mass of a substance. According to an embodiment of the invention, the second phase change material PCM2 may have a latent heat constant greater than that of the first phase change material PCM1. The temperature of a substance may not be changed during the phase change, and an increase in latent heat constant may increase an amount of heat absorbed during the phase change. Therefore, an increase in latent heat constant of the second phase change material PCM2 included in the heat storage sheet HSS may increase an amount of heat absorbed while the second phase change material PCM2 is melted from solid to liquid states.

The second heat transfer chamber HTM2 may have a shape that surrounds the second phase change material PCM2. Because the second heat transfer chamber HTM2 is desired to receive heat from the heat spread sheet HDS and to transfer the heat to the second phase change material PCM2, the second heat transfer chamber HTM2 may include or be formed of a material whose thermal conductivity is high. In an embodiment, for example, the second heat transfer chamber HTM2 may include or be formed of at least one selected from aluminum (Al), gold (Au), silver (Ag), and copper (Cu). The second heat transfer chamber HTM2 may have a thermal conductivity in a range from about 200 W/mK to about 500 W/mK.

The second heat transfer chamber HTM2 may have a thickness sufficient enough to protect its inside or the second phase change material PCM2 from external impact and so forth. In an embodiment, for example, the second heat transfer chamber HTM2 may have a thickness Th4 in a range from about 0.2 mm to about 0.3 mm.

According to an embodiment of the invention, the heat spread sheet HDS may have a thickness Th1 the same as or different from a thickness Th2 of the heat storage sheet HSS. The thickness Th2 of the heat storage sheet HSS may be greater than the thickness Th1 of the heat spread sheet HDS. In an embodiment, for example, the thickness Th1 of the heat spread sheet HDS may be in a range from about 1 mm to about 3 mm, and the thickness Th2 of the heat storage sheet HSS may be equal to or greater than about 3 mm.

Figure 5A:
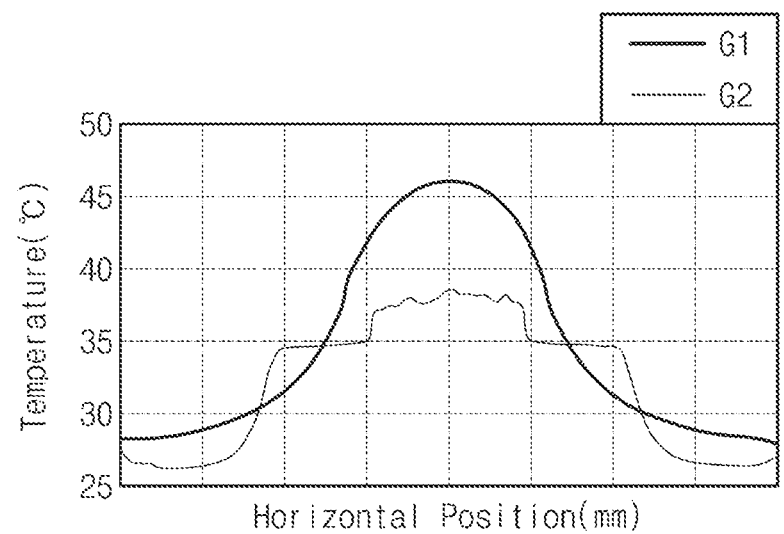
FIG. 5A illustrates a graph showing how temperatures of display panels change with horizontal positions of display panels.
Figure 5B:
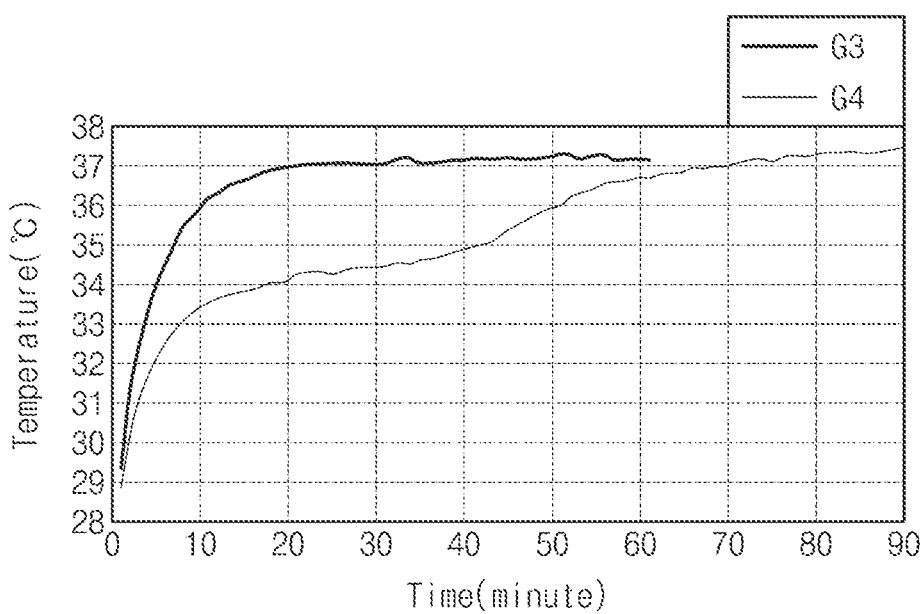
FIG. 5B illustrates a graph showing how temperatures of display panels change with time.

FIG. 5A illustrates a graph showing how temperatures of display panels change with horizontal positions of display panels. FIG. 5B illustrates a graph showing how temperatures of display panels change with time.

When the display panel (see DP of FIG. 3) is operated, heat may be generated from the display element layer (see DP-OLED of FIG. 3). A first graph G1 and a second graph G2 may be graphs showing how a temperature of the display panel DP is changed with a horizontal position of the display panel DP when the display panel DP is operated, and a third graph G3 and a fourth graph G4 may be graphs showing how a temperature of the display panel DP changes with time when the display panel DP is operated.

Referring to FIG. 5A, in the graph an x-axis may indicate a horizontal position of the display panel DP, and a y-axis may indicate a temperature of the display panel DP.

The first graph G1 may be a graph showing a temperature of the display panel DP in accordance with a horizontal position of the display panel DP according to a comparative example. Although not shown, the first graph G1 may be a graph showing a temperature of the display panel DP in accordance with a horizontal position of the display panel DP in a case where graphite is used as a heat spread member attached below the display panel DP. According to the first graph G1, it may be shown that a temperature of the display panel DP is higher in the vicinity of a central side of the display panel DP than in the vicinity of an outer side of the display panel DP. For example, the display panel DP may have a temperature of about 40° C. to about 46° C. in the vicinity of the central side thereof, and may have a temperature of about 27° C. to about 33° C. in the vicinity of the outer side thereof. Because heat is generated from the display element layer DP-OLED disposed on a middle portion of the display panel DP when its operation, a temperature of the display panel DP may be higher in the vicinity of the central side of the display panel DP than in the vicinity of the outer side of the display panel DP.

The second graph G2 may be a graph showing a temperature of the display panel DP in accordance with a horizontal position of the display panel DP in a case where the display panel DP is provided thereunder with the heat spread sheet (see HDS of FIG. 4) and the heat storage sheet (see HSS of FIG. 4) according to an embodiment of the invention. According to the second graph G2, it may be shown that the display panel DP has high temperatures in the vicinity of the central and outer sides thereof, compared to the display panel DP in the case of the first graph G1. For example, the display panel DP may have a temperature of about 36° C. to about 38° C. in the vicinity of the central side of the display panel DP. A maximum temperature of the display panel DP may be lower by about 8° C., compared to the first graph G1. In addition, the display panel DP may have a temperature of about 24° C. to about 26° C. in the vicinity of the outer side of the display panel DP. As the heat spread sheet HDS according to an embodiment of the invention includes the first phase change material PCM1 whose thermal conductivity is high, heat transferred from the display panel DP may be discharged to reduce a maximum temperature of the display panel DP, which may result in an improvement in thermal radiation effect.

Referring to FIG. 5B, in the graph an x-axis may indicate a time, and a y-axis may indicate a temperature of the display panel DP.

The third graph G3 may be a graph showing a temperature of the display panel DP in accordance with a horizontal position of the display panel DP according to a comparative example. Although not shown, the third graph G3 may be a graph showing a temperature of the display panel DP in accordance with a horizontal position of the display panel DP in a case where only the heat spread sheet HDS is attached below the display panel DP. According to the third graph G3, it may be shown that a temperature of the display panel DP gradually increases as time passes, and after about 30 minutes, the temperature of the display panel DP may reach about 37° C. that is a maximum temperature of the display panel DP. For example, according to the third graph G3, it may be shown that, when the display panel DP starts its operation, a temperature of the display panel DP abruptly increases until about 10 minute time point after the operation of the display panel DP, gently rises from about 10 minute time point to about 30 minute time point, and then continuously maintains about 37° C. after about 30 minute time point.

The fourth graph G4 may be a graph showing a temperature of the display panel DP in accordance with a horizontal position of the display panel DP in a case where the display panel DP is provided thereunder with the heat spread sheet (see HDS of FIG. 4) and the heat storage sheet (see HSS of FIG. 4) according to an embodiment of the invention. According to the fourth graph G4, it may be ascertained that a temperature of the display panel DP gradually increases as time passes, and after about 70 minutes, the temperature of the display panel DP may reach about 37° C. that is a maximum temperature of the display panel DP. For example, according to the fourth graph G4, it may be shown that, when the display panel DP starts its operation, a temperature of the display panel DP abruptly increases until about 10 minute time point after the operation of the display panel DP, gently rises from about 10 minute time point to about 70 minute time point, and then continuously maintains about 37° C. after about 70 minute time point.

It may be confirmed that, compared to the third graph G3, the fourth graph G4 has a long time to reach the maximum temperature of the display panel DP. For example, to reach the maximum temperature, or about 37° C., of the display panel DP, the third graph G3 may has about 30 minutes and the fourth graph G4 may has about 70 minutes. There may thus be a difference of about 40 minutes in time to reach the maximum temperature of the display panel DP in the fourth graph G4 compared to the third graph G3. As the heat storage sheet HSS according to an embodiment of the invention includes the second phase change material PCM2 whose latent heat is high, the second phase change material PCM2 may absorb heat transferred from the heat spread sheet HDS to allow the display panel DP to maintain its low temperature for a long time.

Figure 6:
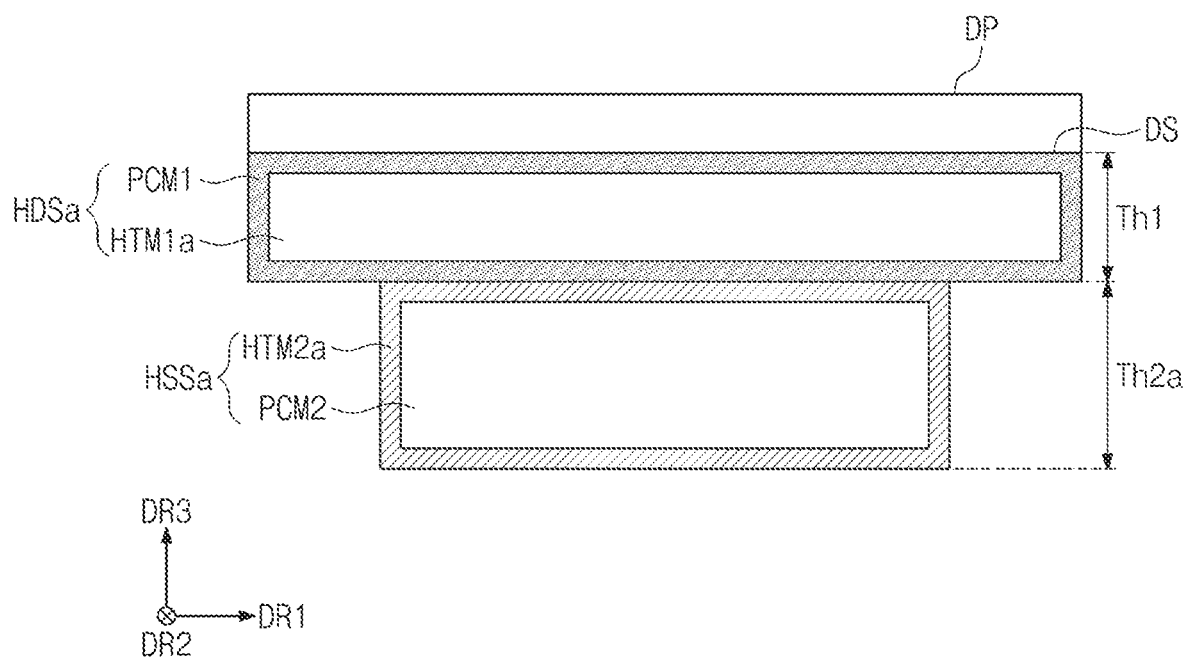
FIG. 6 illustrates a cross-sectional view showing a heat spread sheet and a heat storage sheet according to an embodiment of the invention.

FIG. 6 illustrates a cross-sectional view showing a heat spread sheet and a heat storage sheet according to an embodiment of the invention.

Referring to FIG. 6, in an embodiment, a heat spread sheet HDSa may be disposed below the display panel DP and may be in contact with the bottom surface DS (or the first surface) of the display panel DP. A heat storage sheet HSSa may be disposed below and in contact with the heat spread sheet HDSa. According to an embodiment of the invention, the heat spread sheet HDSa may be in contact with the entirety (or an entire portion) of the first surface DS. Because heat is transferred from the display panel DP to the heat spread sheet HDSa, and because the heat spread sheet HDSa is in contact with the entirety of the first surface DS, it may be possible to effectively discharge the heat transferred from the display panel DP. The invention, however, is not limited thereto, and the heat spread sheet HDSa may be in contact with a portion of the first surface DS. In an embodiment, for example, the heat spread sheet HDSa may be in contact with a central portion of the first surface DS.

When viewed on a plane parallel to the first and second directions DR1 and DR2, or in a plan view viewed in the third direction DR3, the heat spread sheet HDSa may have a planar area greater than that of the heat storage sheet HSSa. According to an embodiment of the invention, when viewed in a plan view, the heat spread sheet HDSa may partially overlap the heat storage sheet HSSa. In an embodiment, as the entirety of the heat storage sheet HSSa is in contact with and overlapping the heat spread sheet HDSa, the heat spread sheet HDSa may produce efficient heat diffusion to the heat storage sheet HSSa.

According to an embodiment of the invention, the heat spread sheet HDSa may have a thickness Th1 different from a thickness Th2a of the heat storage sheet HSSa. In an embodiment, for example, the thickness Th2a of the heat storage sheet HSSa may be greater than the thickness Th1 of the heat spread sheet HDSa. In an embodiment, for example, the thickness Th1 of the heat spread sheet HDSa may be in a range from about 1 mm to about 3 mm, and the thickness Th2a of the heat storage sheet HSSa may be equal to or greater than about 3 mm.

According to an embodiment of the invention, the heat storage sheet HSSa may have a volume different from that of the heat spread sheet HDSa. The volume of the heat storage sheet HSSa may be greater than that of the heat spread sheet HDSa. An increase in volume of the heat storage sheet HSSa may cause an increase in mass of a second phase change material PCM2 included in the heat storage sheet HSSa, which may result in an increase in latent heat of the second phase change material PCM2. Therefore, the second phase change material PCM2 may absorb a large amount of heat while being melted from solid to liquid states, and the heat storage sheet HSSa may have increased heat storage capacity.

Figure 7A:
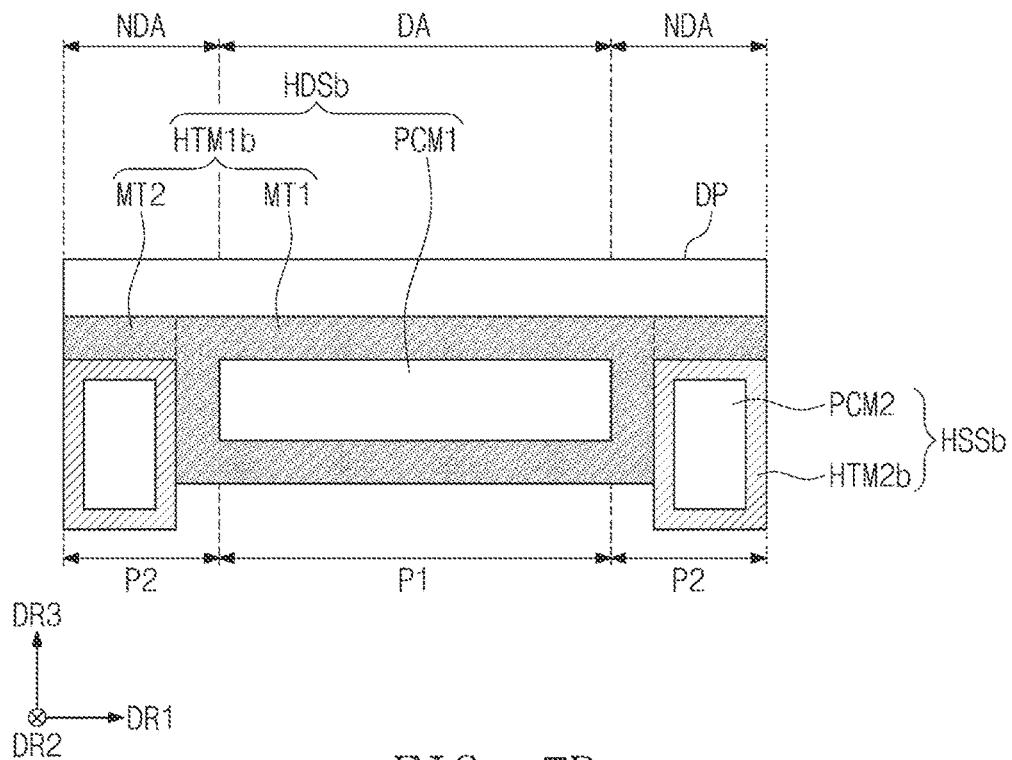
FIG. 7A illustrates a cross-sectional view showing a heat spread sheet and a heat storage sheet according to an embodiment of the invention.
Figure 7B:
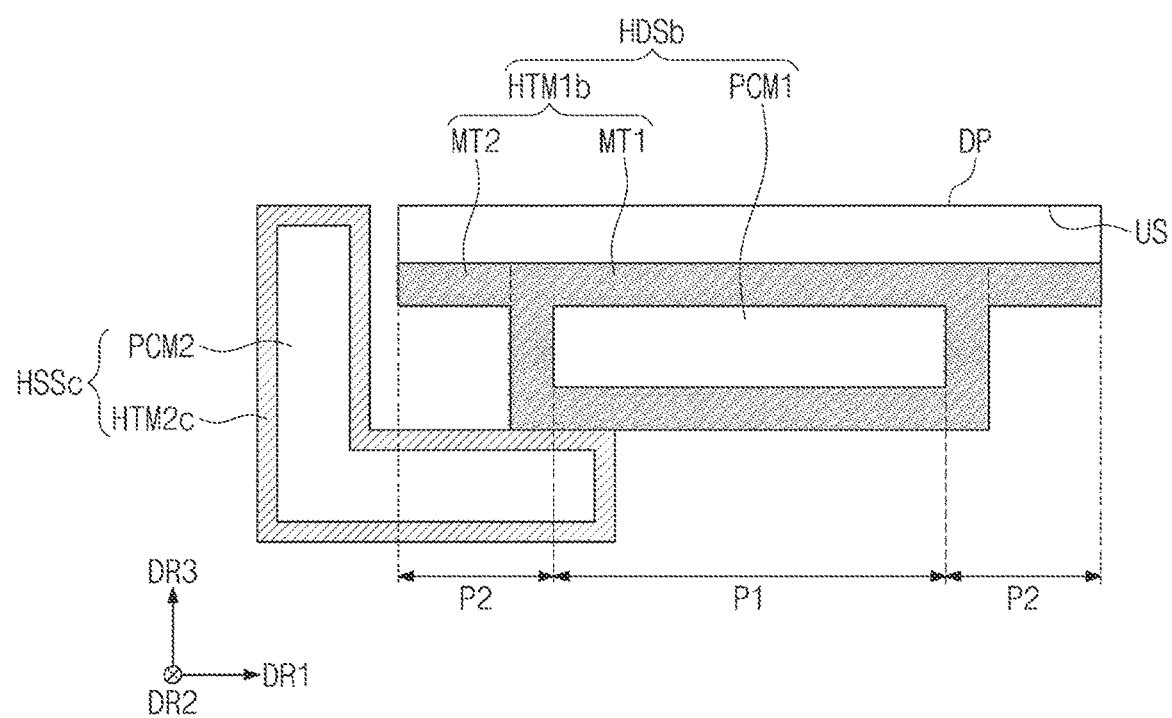
FIG. 7B illustrates a cross-sectional view showing a heat spread sheet and a heat storage sheet according to an embodiment of the invention.

FIG. 7A illustrates a cross-sectional view showing a heat spread sheet and a heat storage sheet according to an embodiment of the invention. FIG. 7B illustrates a cross-sectional view showing a heat spread sheet and a heat storage sheet according to an embodiment of the invention.

Referring to FIG. 7A, in an embodiment, the display panel DP may include the display region DA and the non-display region NDA. The display region DA may be an area that corresponds to the display element layer (see DP-OLED of FIG. 3). The non-display region NDA may be an area that is adjacent to an outer side of the display region DA and does not overlap the display element layer DP-OLED. A heat spread sheet HDSb may be disposed below the display panel DP, and a heat storage sheet HSSb may be disposed below the heat spread sheet HDSb.

According to an embodiment of the invention, the heat spread sheet HDSb may include a first part P1 in which a first phase change material PCM1 is disposed and a second part P2 in which the first phase change material PCM1 is not disposed. The first part P1 may overlap the display region DA. In an embodiment, as shown in FIG. 7A, the first part P1 corresponds to the display region DA, but the invention is not limited thereto, and when viewed in a plan view or in the third direction DR3, the first part P1 may be formed wider than the display region DA. The second part P2 may correspond to the non-display region NDA. The invention, however, is not limited thereto, and the second part P2 may overlap only a portion of the non-display region NDA.

The heat spread sheet HDSb may include the first phase change material PCM1 and a first heat transfer chamber HTM1b that surrounds the first phase change material PCM1. The first heat transfer chamber HTM1b may include a first metal segment MT1 in direct contact with the first phase change material PCM1 and a second metal segment MT2 that extends from the first metal segment MT1. When viewed in a plan view, the first metal segment MT1 may overlap the first part P1 and a portion of the second part P2. When viewed in a plan view, the second metal segment MT2 may not overlap the first part P1 and may overlap the second part P2.

The first metal segment MT1 and the second metal segment MT2 may include or be formed of a same material as each other. Because the first metal segment MT1 and the second metal segment MT2 are desired to transfer heat generated from the display panel DP, the first metal segment MT1 and the second metal segment MT2 may include or be formed of a material whose thermal conductivity is high. In an embodiment, for example, each of the first metal segment MT1 and the second metal segment MT2 may include or be formed of at least one selected from aluminum (Al), gold (Au), silver (Ag), and copper (Cu). The invention, however, is not limited thereto, and the first metal segment MT1 and the second metal segment MT2 may include or be formed of different materials from each other. In an embodiment where the first metal segment MT1 and the second metal segment MT2 are formed of different materials from each other, the first metal segment MT1 may have a thermal conductivity greater than that of the second metal segment MT2.

When viewed in a plan view, the heat spread sheet HDSb may overlap the display region DA. The display region DA may be an area that corresponds to the display element layer DP-OLED, and according to an embodiment of the invention, the heat spread sheet HDSb may overlap the display element layer DP-OLED when viewed in a plan view. Because heat of the display panel DP is mainly generated from the display element layer DP-OLED, the heat spread sheet HDSb may be disposed on the display region DA most adjacent to the display element layer DP-OLED to promptly discharge the heat generated from the display element layer DP-OLED. The invention, however, is not limited thereto, and as shown in this disclosure, the display region DA may overlap only the first part P1 in which the first phase change material PCM1 is disposed.

The heat storage sheet HSSb may include a second phase change material PCM2 and a second heat transfer chamber HTM2b. The heat storage sheet HSSb may overlap the second part P2. In an embodiment, for example, the second phase change material PCM2 may overlap the second part P2. Therefore, the first phase change material PCM1 and the second phase change material PCM2 may not overlap each other when viewed in a plan view. The heat storage sheet HSSb may be in contact with the first metal segment MT1 and the second metal segment MT2. As the heat storage sheet HSSb is in contact with the first metal segment MT1, heat may be efficiently transferred from the first phase change material PCM1 to the second phase change material PCM2 included in the heat storage sheet HSSb. The invention, however, is not limited thereto, and the second heat transfer chamber HTM2b included in the heat storage sheet HSSb may extend to partially overlap the first part P1. Although it is illustrated in FIG. 7A that the heat storage sheet HSSb is disposed at an outer side of the heat spread sheet HDSb while overlapping the second part P2, when viewed in a plan view, the heat storage sheet HSSb may be provided in the form of a ring or frame shape to surround the heat spread sheet HDSb.

Referring to FIG. 7B, in an embodiment, a heat storage sheet HSSc may be in contact with at least a portion of the heat spread sheet HDSb. According to an embodiment of the invention, the heat storage sheet HSSc may be in contact with at least a portion of the first part P1 included in the heat spread sheet HDSb. As the heat storage sheet HSSc is in contact with at least a portion of the first part P1, the heat storage sheet HSSc may efficiently receive heat transferred from the first phase change material PCM1. The invention, however, is not limited thereto, and the heat storage sheet HSSc may be in contact with only the second part P2 without being in contact with the first part P1.

According to an embodiment of the invention, a portion of the heat storage sheet HSSc may not overlap the heat spread sheet HDSb. As shown in FIG. 7B, a portion of the heat storage sheet HSSc may overlap a portion of the first part P1 and a portion of the second part P2, and another portion of the heat storage sheet HSSc may not overlap any of the first part P1 and the second part P2. In an embodiment, for example, the heat storage sheet HSSc may have a portion that does not overlap the first part P1 and the second part P2, and the non-overlapping portion of the heat storage sheet HSSc may have a shape that extends in a direction opposite to the first direction DR1 and then extends in the third direction DR3 to a surface parallel to a top surface US of the display panel DP. In this case, the heat storage sheet HSSc may have an L-like shape.

As the heat storage sheet HSSc is formed to have a large-sized portion that does not overlap the heat spread sheet HDSb, mass of a second phase change material PCM2 included in the heat storage sheet HSSc may be increased to increase a latent heat of the second phase change material PCM2. Therefore, the second phase change material PCM2 may absorb a large amount of heat while being melted from solid to liquid states, and the heat storage sheet HSSc may have increased heat storage capacity. In addition, a shape of the heat storage sheet HSSc may be variously changed without being limited to that shown in the drawings. Therefore, the heat storage sheet HSSc according to an embodiment of the invention may be attached to a portion of the heat spread sheet HDSc to be used as a stand (e.g., desk lamp), a wall-mounted bracket, a set cover, and so forth.

Figure 8A:
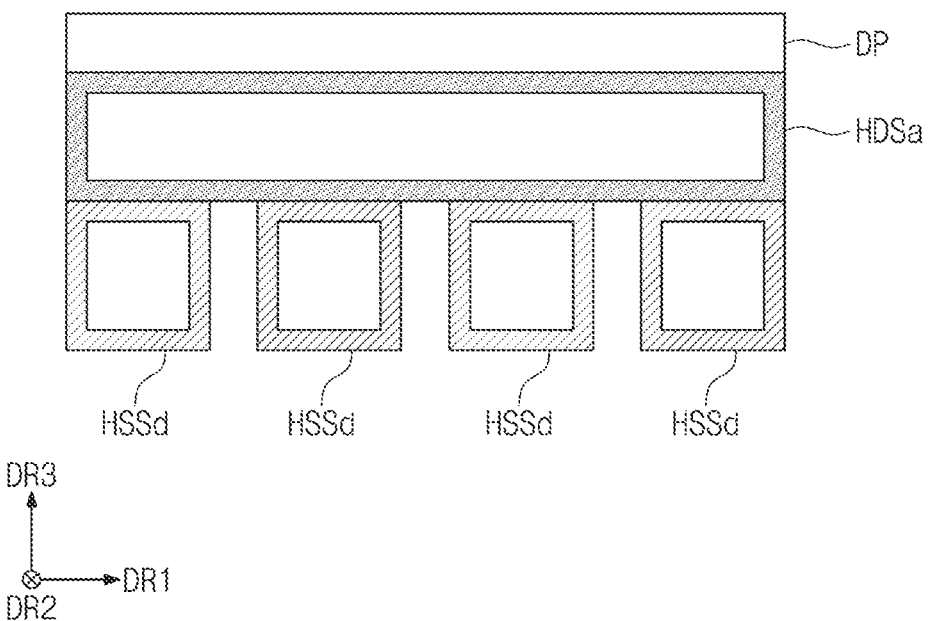
FIG. 8A illustrates a cross-sectional view showing a heat spread sheet and a heat storage sheet according to an embodiment of the invention.
Figure 8B:
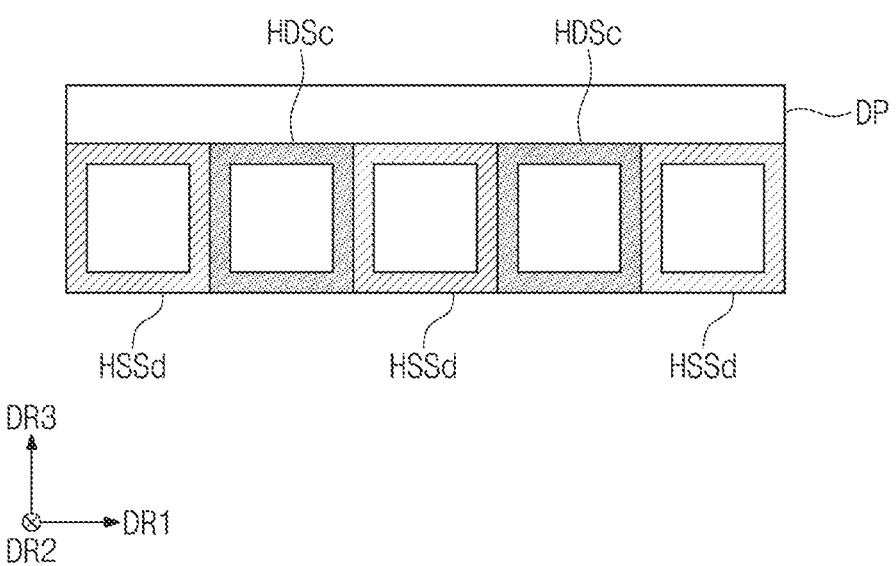
FIG. 8B illustrates a cross-sectional view showing a heat spread sheet and a heat storage sheet according to an embodiment of the invention.

FIG. 8A illustrates a cross-sectional view showing a heat spread sheet and a heat storage sheet according to an embodiment of the invention. FIG. 8B illustrates a cross-sectional view showing a heat spread sheet and a heat storage sheet according to an embodiment of the invention.

Referring to FIG. 8A, in an embodiment, a heat storage sheet HSSd may be provided in plural, and the plurality of heat storage sheets HSSd may be disposed spaced apart from each other on a rear surface of the heat spread sheet HDSa. In an embodiment, for example, each of the plurality of heat storage sheets HSSd may be disposed spaced apart from each other in the first direction DR1 while being in contact with the heat spread sheet HDSa. The plurality of heat storage sheets HSSd may have a same size and shape as each other. The invention, however, is not limited thereto, and the plurality of heat storage sheets HSSd may have different sizes and shapes from each other. Although four heat storage sheets HSSd are illustrated in FIG. 8A, the invention is not limited thereto. Although it is illustrated in FIG. 8A that the plurality of heat storage sheets HSSd are spaced apart from each other with a same (or constant) interval, the invention is not limited thereto and the plurality of heat storage sheets HSSd may be spaced apart from each other at different intervals from each other.

When viewed in a plan view, each of the plurality of heat storage sheets HSSd may overlap the heat spread sheet HDSa. In an embodiment, for example, when viewed in a plan view, each of the plurality of heat storage sheets HSSd may be disposed to contact and overlap the heat spread sheet HDSa. As shown in this disclosure, as each of the plurality of heat storage sheets HSSd contacts and overlaps the heat spread sheet HDSa when viewed in plan, the heat spread sheet HDSa may produce efficient heat diffusion to the heat storage sheet HSSa. The invention, however, is not limited thereto, and when viewed in a plan view, at least one selected from the plurality of heat storage sheets HSSd may partially overlap the heat spread sheet HDSa or may not overlap the heat spread sheet HDSa.

Referring to FIG. 8B, in an embodiment, a heat spread sheet HDSc may be provided in plural, and the plurality of heat spread sheets HDSc may be disposed spaced apart from each other. In an embodiment, for example, the plurality of heat spread sheets HDSc may be disposed spaced apart from each other in the first direction DR1 while being in contact with the display panel DP.

According to an embodiment of the invention, the plurality of heat spread sheets HDSc may be disposed alternately with the plurality of heat storage sheets HSSd. In an embodiment, for example, each of the plurality of heat spread sheets HDSc and each of the plurality of heat storage sheets HSSd may be disposed apart from each other in the first direction DR1 while being in contact with the display panel DP. As the plurality of heat spread sheets HDSc are disposed to directly contact the display panel DP, it may be possible to effectively discharge heat transferred from the display panel DP. As the plurality of heat storage sheets HSSd are disposed in spaces between the plurality of heat spread sheets HDSc spaced apart from each other, and as lateral surfaces of the plurality of heat storage sheets HSSa are in contact with lateral surfaces of the plurality of heat spread sheets HDSc, within the limited space, heat may be efficiently transferred from each of the heat spread sheets HDSc to its contacted one of the plurality of heat storage sheets HSSd.

Figure 9A:
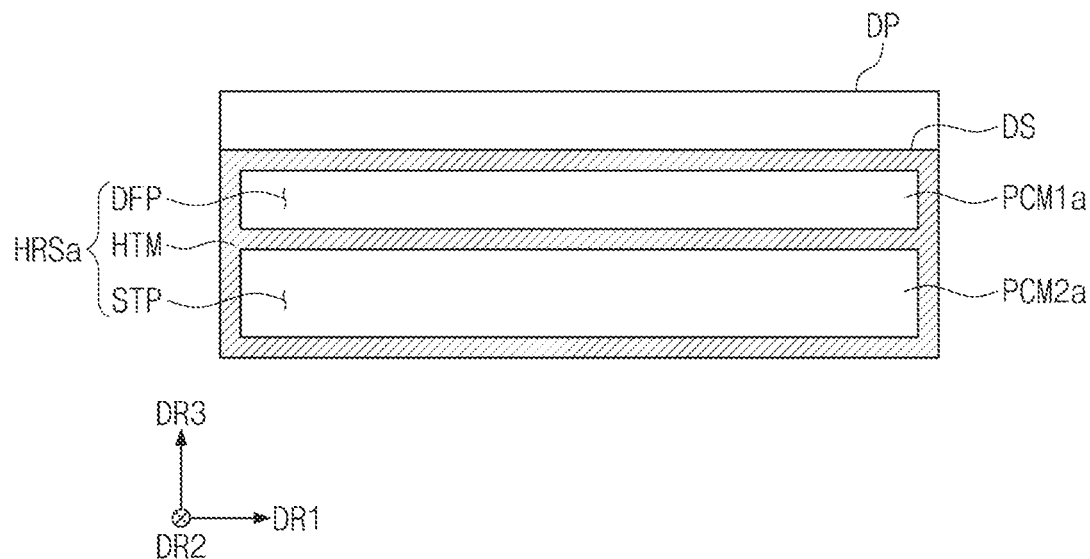
FIG. 9A illustrates a cross-sectional view showing a heat radiation sheet according to an embodiment of the invention.
Figure 9B:
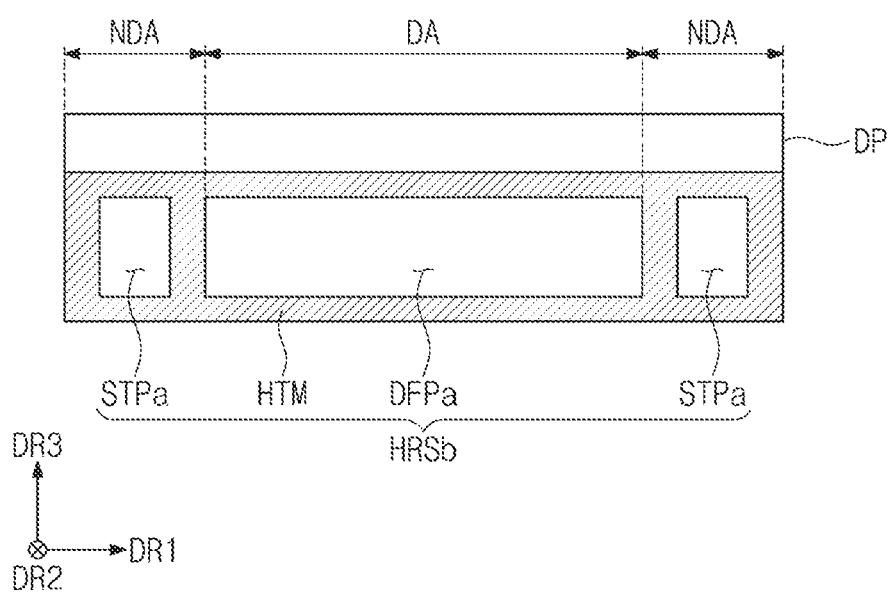
FIG. 9B illustrates a cross-sectional view showing a heat radiation sheet according to an embodiment of the invention.
Figure 9C:
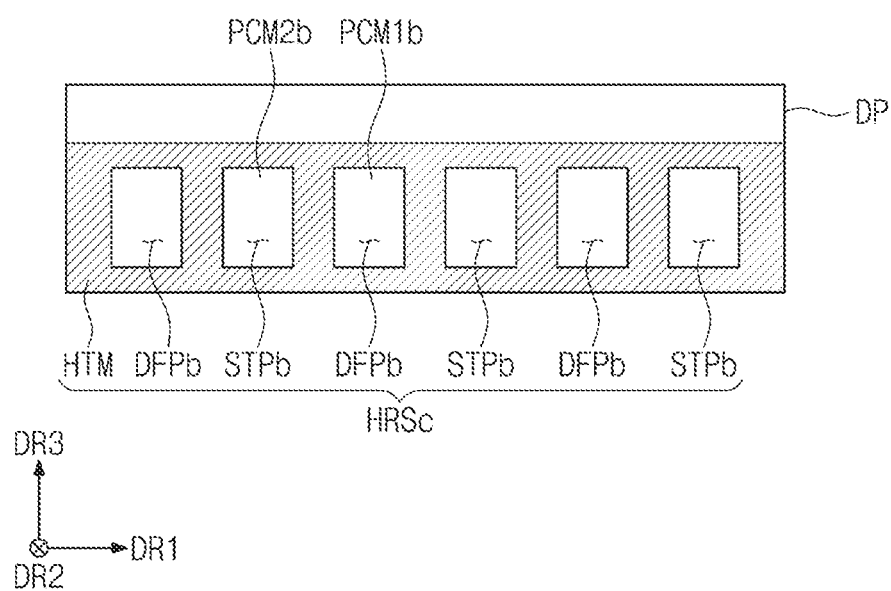
FIG. 9C illustrates a cross-sectional view showing a heat radiation sheet according to an embodiment of the invention.

FIG. 9A illustrates a cross-sectional view showing a heat radiation sheet according to an embodiment of the invention. FIG. 9B illustrates a cross-sectional view showing a heat radiation sheet according to an embodiment of the invention. FIG. 9C illustrates a cross-sectional view showing a heat radiation sheet according to an embodiment of the invention.

Referring to FIG. 9A, in an embodiment, a heat radiation sheet HRSa may be disposed below the display panel DP and in contact with the bottom surface DS (or first surface) of the display panel DP. The heat radiation sheet HRSa may include a diffusion part DFP in which a first phase change material PCM1a is disposed, a storage part STP which is adjacent to the diffusion part DFP and in which a second phase change material PCM2a is disposed. In such an embodiment, the heat radiation sheet HRSa may include a heat transfer chamber HTM, and the diffusion part DEP and the storage part STP may be defined in the heat transfer chamber HTM.

The diffusion part DFP may be disposed adjacent to the display panel DP. In an embodiment, for example, the diffusion part DFP may be disposed adjacent to the display panel DP across the heat transfer chamber HTM. As shown in FIG. 9A, the diffusion part DFP may have a rectangular shape, but the invention is not limited thereto.

The first phase change material PCM1a may be disposed in the diffusion part DFP. According to an embodiment of the invention, the first phase change material PCM1a may include a material whose phase is changed from liquid to gaseous states by receiving heat from the display panel DP. In an embodiment, for example, the first phase change material PCM1a may include at least one selected from methanol, ethanol, acetone, isopropyl alcohol (IPA), and water.

The storage part STP may be disposed adjacent to the diffusion part DFP. In an embodiment, for example, when viewed in the third direction DR3, the diffusion part DFP may be disposed adjacent to the display panel DP across the heat transfer chamber HTM. As shown in FIG. 9A, the storage part STP may have a rectangular shape, but the invention is not limited thereto.

The second phase change material PCM2a may be disposed in the storage part STP. The second phase change material PCM2a may be different from the first phase change material PCM1a. The second phase change material PCM2a may have a boiling point greater than that of the first phase change material PCM1a. According to an embodiment of the invention, the second phase change material PCM2a may include a material whose phase is changed from solid to liquid states by receiving heat from the first phase change material PCM1a. In an embodiment, for example, the second phase change material PCM2a may include a paraffin wax.

The heat transfer chamber HTM may have a shape that surrounds the first phase change material PCM1a and the second phase change material PCM2a. In an embodiment, for example, the heat transfer chamber HTM may have a shape that provides the diffusion part DFP adjacent to the display panel DP and the storage part STP spaced in the third direction DR3 from the diffusion part DFP.

The heat transfer chamber HTM may include or be formed of a material whose thermal conductivity is high to allow heat to transfer to the first phase change material PCM1a from the display panel DP from which the heat is transmitted and also to allow heat to transfer to the second phase change material PCM2a from the first phase change material PCM1a from which the heat is transmitted. In an embodiment, for example, the heat transfer chamber HTM may be formed of at least one selected from aluminum (Al), gold (Au), silver (Ag), and copper (Cu). According to an embodiment of the invention, the first phase change material PCM1a may have a thermal conductivity greater than that of the heat transfer chamber HTM. In an embodiment, for example, the first phase change material PCM1a may have a thermal conductivity in a range from about 1,000 W/mK to about 10,000 W/mK, and the heat transfer chamber HTM may have a thermal conductivity in a range from about 200 W/mK to about 500 W/mK.

The heat transfer chamber HTM may have a thickness sufficient enough to protect, from external impact and so forth, its inside or the first phase change material PCM1a and the second phase change material PCM2a. In an embodiment, for example, the heat transfer chamber HTM may have a thickness in a range from about 0.2 mm to about 0.3 mm.

According to an embodiment of the invention, when viewed in a plan view, the storage part STP may overlap the diffusion part DFP. As shown in FIG. 9A, when viewed in a plan view, the entirety of the storage part STP may overlap the diffusion part DFP, and as the entirety of the storage part STP may be disposed adjacent to the diffusion part DFP, the first phase change material PCM1a included in the diffusion part DFP may efficiently diffuse heat, which is transferred from the display panel DP, to the second phase change material PCM2a included in the storage part STP.

According to an embodiment of the invention, the storage part STP may have a volume different from that of the diffusion part DFP. The volume of the storage part STP may be greater than that of the diffusion part DFP. An increase in volume of the storage part STP may cause an increase in mass of the second phase change material PCM2a included in the storage part STP, which may result in an increase in latent heat of the second phase change material PCM2a. Therefore, the second phase change material PCM2 may absorb a large amount of heat from the first phase change material PCM1a, while being melted from solid to liquid states due to heat transferred from the first phase change material PCM1a.

Referring to FIG. 9B, in an embodiment, the display panel DP may include the display region DA and the non-display region NDA. The display region DA may be an area that corresponds to the display element layer (see DP-OLED of FIG. 3). The non-display region NDA may be an area that is adjacent to an outer side of the display region DA and does not overlap the display element layer DP-OLED. A heat radiation sheet HRSb may be disposed below and in contact with the display panel DP.

A diffusion part DFPa may be disposed adjacent to the display panel DP. In an embodiment, for example, when viewed in the third direction DR3, the diffusion part DFPa may be disposed adjacent to the display panel DP across a heat transfer chamber HTM.

When viewed in a plan view, the diffusion part DFPa may overlap the display region DA. The display region DA may be an area that corresponds to the display element layer DP-OLED, and according to an embodiment of the invention, the diffusion part DFPa may overlap the display element layer DP-OLED when viewed in a plan view. Because heat of the display panel DP is mainly generated from the display element layer DP-OLED, the diffusion part DFPa may be disposed on the display region DA most adjacent to the display element layer DP-OLED to promptly discharge the heat generated from the display element layer DP-OLED.

A storage part STPa may be disposed adjacent to the diffusion part DFPa and the display panel DP. In an embodiment, for example, the storage part STPa may be disposed adjacent in the third direction DR3 to the display panel DP across the heat transfer chamber HTM and in the first direction DR1 to the diffusion part DFPa across the heat transfer chamber HTM.

The storage part STPa may overlap the non-display region NDA. According to an embodiment of the invention, the storage part STPa may not overlap the display element layer DP-OLED corresponding to the display region DA. The invention, however, is not limited thereto, and when viewed in a plan view, the storage part STPa may partially overlap the display element layer DP-OLED corresponding to the display region DA.

Referring to FIG. 9C, in an embodiment, a heat radiation sheet HRSc may include a plurality of diffusion parts DFPb and a plurality of storage parts STPb. The plurality of diffusion parts DFPb may be disposed spaced apart from each other. In an embodiment, for example, the plurality of diffusion parts DFPb may be disposed spaced apart from each other in the first direction DR1 while being in contact with the display panel DP.

According to an embodiment of the invention, the plurality of diffusion parts DFPb and the plurality of storage parts STPb may be disposed alternately with each other. In an embodiment, for example, the plurality of diffusion parts DFPb and the plurality of storage parts STPb may be disposed adjacent in the third direction DR3 to the display panel DP and in the first direction DR1 to each other. As the plurality of diffusion parts DFPb are disposed adjacent to the display panel DP, the diffusion part DFPb may satisfactorily discharge heat transferred from the display panel DP. As the plurality of storage parts STPb are disposed in spaces between the plurality of diffusion parts DFPb spaced apart from each other, and as lateral surfaces of the plurality of storage parts STPb are disposed in contact with lateral surfaces of the plurality of diffusion parts DFPb, within the limited space, heat may be efficiently transferred from a first phase change material PCM1b included in the diffusion part DFPb to a second phase change material PCM2b included in the storage part STPb.

According to embodiments of the invention, as a heat spread sheet includes a first phase change material, heat transferred from a display panel may be discharged through the heat spread sheet to reduce a maximum temperature of the display panel and to improve a heat radiation effect, and as a heat storage sheet includes a second phase change material, heat transferred from the heat spread sheet may be absorbed by the heat storage sheet to allow the display panel to maintain its low temperature for a long time.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
a display panel;
a heat spread sheet below the display panel and in contact with a first surface of the display panel; and
a heat storage sheet in contact with at least a portion of the heat spread sheet,
wherein the heat spread sheet includes a first phase change material, and
wherein the heat storage sheet includes a second phase change material having a boiling point greater than a boiling point of the first phase change material.

2. The display device of claim 1, wherein the first phase change material includes a material whose phase is changed from liquid to gaseous states by receiving heat from the display panel.

3. The display device of claim 1, wherein the second phase change material includes a material whose phase is changed from solid to liquid states by receiving heat from the heat spread sheet.

4. The display device of claim 1, wherein a planar area of the heat spread sheet is greater than a planar area of the heat storage sheet.

5. The display device of claim 4, wherein
the heat spread sheet is in contact with an entirety of the first surface, and
the heat storage sheet overlaps the heat spread sheet when viewed in a plan view.

6. The display device of claim 1, wherein a volume of the heat storage sheet is greater than a volume of the heat spread sheet.

7. The display device of claim 1, wherein
the heat storage sheet is provided in plural, and
a plurality of heat storage sheets are spaced apart from each other on a rear surface of the heat spread sheet.

8. The display device of claim 1, wherein
each of the heat spread sheet and the heat storage sheet is provided in plural, and
a plurality of heat spread sheets and a plurality of heat storage sheets are disposed alternately with each other.

9. The display device of claim 1, wherein
the heat spread sheet further includes a first heat transfer chamber which surrounds the first phase change material, and
the heat storage sheet further includes a second heat transfer chamber which surrounds the second phase change material.

10. The display device of claim 9, wherein each of the first and second heat transfer chambers includes a metal whose thermal conductivity is high.

11. The display device of claim 1, wherein the heat spread sheet includes:
a first part in which the first phase change material is disposed; and
a second part in which the first phase change material is not disposed.

12. The display device of claim 11, wherein the heat storage sheet is in contact with the first part.

13. The display device of claim 1, wherein
the display panel includes a base layer, a circuit layer on the base layer, and a display element layer on the circuit layer, and
the heat spread sheet overlaps the display element layer when viewed in a plan view.

14. A display device, comprising:
a display panel; and
a heat radiation sheet below the display panel and in contact with a first surface of the display panel,
wherein the heat radiation sheet includes:
a diffusion part adjacent to the display panel, wherein a first phase change material which receives heat from the display panel is disposed in the diffusion part;
a storage part adjacent to the first phase change material, wherein a second phase change material which receives heat from the first phase change material is disposed in the storage part; and a heat transfer chamber which surrounds each of the first phase change material and the second phase change material, wherein a thermal conductivity of the first phase change material is greater than a thermal conductivity of the heat transfer chamber.

15. The display device of claim 14, wherein a boiling point of the second phase change material is greater than a boiling point of the first phase change material.

16. The display device of claim 15, wherein
the first phase change material includes a material whose phase is changed from liquid to gaseous states by the heat from the display panel, and
the second phase change material includes a material whose phase is changed from solid to liquid states by the heat from the first phase change material.

17. The display device of claim 14, wherein
the diffusion part is below the display panel, and
the storage part is below and overlaps the diffusion part when viewed in a plan view.

18. The display device of claim 14, wherein a volume of the storage part is greater than a volume of the diffusion part.

19. The display device of claim 14, wherein
each of the diffusion part and the storage part is provided in plural, and
a plurality of diffusion parts and a plurality of storage parts are disposed alternately with each other.

20. The display device of claim 14, wherein
the display panel includes a base layer, a circuit layer on the base layer, and a display element layer on the circuit layer,
the diffusion part overlaps the display element layer when viewed in a plan view, and
the storage part does not overlap the display element layer when viewed in the plan view.

* * * * *